United States Patent
Ho

(10) Patent No.: US 9,188,612 B2
(45) Date of Patent: Nov. 17, 2015

(54) FREQUENCY MEASUREMENT DEVICE AND FREQUENCY MEASUREMENT METHOD

(71) Applicant: INSTITUTE FOR INFORMATION INDUSTRY, Taipei (TW)

(72) Inventor: Tzong-Hsien Ho, Taipei (TW)

(73) Assignee: INSTITUTE FOR INFORMATION INDUSTRY, Taipei (TW)

( * ) Notice: Subject to any disclaimer, the term of this patent is extended or adjusted under 35 U.S.C. 154(b) by 92 days.

(21) Appl. No.: 14/133,648

(22) Filed: Dec. 19, 2013

(65) Prior Publication Data

US 2015/0177295 A1    Jun. 25, 2015

(51) Int. Cl.
   *G01R 23/02* (2006.01)
   *G01R 21/00* (2006.01)

(52) U.S. Cl.
   CPC .............. *G01R 23/02* (2013.01); *G01R 21/00* (2013.01)

(58) Field of Classification Search
   USPC ............ 324/76.39, 76.11, 76, 12, 76.41, 520, 324/601; 342/111, 112, 128, 200, 129; 73/579, 618
   See application file for complete search history.

(56) References Cited

U.S. PATENT DOCUMENTS

| 4,041,783 | A | * | 8/1977 | Shimauchi et al. | ............. 73/648 |
| 5,262,714 | A | * | 11/1993 | Friedman | ................... 324/76.42 |
| 7,046,001 | B2 | * | 5/2006 | Tada et al. | ..................... 324/230 |
| 2007/0165702 | A1 | * | 7/2007 | Yokoyama | .................... 375/147 |
| 2013/0241531 | A1 | * | 9/2013 | Hopsecger et al. | ........ 324/76.39 |

FOREIGN PATENT DOCUMENTS

CN    101732033 A    6/2010
CN    102885616 A    1/2013

OTHER PUBLICATIONS

The examination report of the corresponding Taiwan application No. TW102147191.

* cited by examiner

*Primary Examiner* — Melissa Koval
*Assistant Examiner* — Nasima Monsur
(74) *Attorney, Agent, or Firm* — CKC & Partners Co., Ltd.

(57) ABSTRACT

A frequency measurement device includes a filter, a detecting module and a calculating module. The filter is configured to receive an input signal, and filter the input signal to generate a signal under measurement. The detecting module is configured to detect a plurality of wave peaks or a plurality of wave troughs of the signal under measurement through a second order differentiator, so as to generate a plurality of detecting signals. The detecting signals correspond to the wave peaks or the wave troughs respectively. The calculating module is configured to receive the detecting signals, and calculate a frequency of the signal under measurement according to the detecting signals.

6 Claims, 5 Drawing Sheets

FREQUENCY MEASUREMENT DEVICE AND FREQUENCY MEASUREMENT METHOD

BACKGROUND

1. Field of Invention

The present invention relates to an electronic device. More particularly, the present invention relates to a frequency measurement device and a frequency measurement method.

2. Description of Related Art

With the fast progress of technology, various kinds of electronic devices have diffused into our daily lives.

An electricity system is configured to provide an electrical power signal to drive the electronic devices. The frequency of the electrical power signal is of vital importance to the safety of electricity. In case the frequency of the electrical power signal is not stable, the electronic device receiving the electronic signal may be damaged or burned, raising the safety risk.

Typically, an electrical power signal is captured with an analog to digital converter, and the captured electrical power signal is post-processed by a processor, so as to calculate the frequency of the electrical power signal. However, in such a manner, a relative higher cost of frequency measurement is incurred, and the real-time monitoring the frequency of the electrical power signal becomes impossible.

In order to monitor the frequency of the electrical power signal in real-time, a more effective frequency measurement device is desired.

SUMMARY

One aspect of the present disclosure is related to a frequency measurement device. In accordance with one embodiment of the present disclosure, the frequency measurement device includes a filter, a detecting module and a calculating module. The filter is configured to receive an input signal, and filter the input signal to generate a signal under measurement. The detecting module is configured to detect a plurality of wave peaks or a plurality of wave troughs of the signal under measurement through a second order differentiator to generate a plurality of detecting signals. The detecting signals correspond to the wave peaks or the wave troughs respectively. The calculating module is configured to receive the detecting signals, and calculate a frequency of the signal under measurement according to the detecting signals.

Another aspect of the present disclosure is related to a frequency measurement method. In accordance with one embodiment of the present disclosure; the frequency measurement method includes filtering an input signal to generate a signal under measurement; detecting a plurality of the wave peaks or a plurality of wave troughs of the signal under measurement through a second differentiator to generate a plurality of detecting signals, in which the detecting signals correspond to the wave peaks or the wave troughs respectively; and calculating a frequency of the signal under measurement according to the detecting signals.

Through an application of one embodiment described above, the frequency of the signal under measurement can be monitored, so as to ensure the stability of the frequency of the signal under measurement.

DETAILED DESCRIPTION

Ideas of the disclosure will be described clearly in the following detailed description with reference to the drawings. After learning the embodiments of the disclosure, those of skills in the art can make variations and modifications with reference to the technology taught in the disclosure, without departing from the spirit and scope of the disclosure.

It will be understood that, in the description herein and throughout the claims that follow, when an element is referred to as being "electrically connected" to another element, it can be directly connected or coupled to the other element or intervening elements may be present. Moreover, "electrically connect" can further refer to the interoperation or interaction between two or more elements.

It will be understood that, in the description herein and throughout the claims that follow, although the terms first, second, etc. may be used to describe various elements, these elements should not be limited by these terms. These terms are only used to distinguish one element from another.

It will be understood that, in the description herein and throughout the claims that follow, the terms "comprise" or "comprising," "include" or "including," "have" or "having," "contain" or "containing" and the like are to be understood to be open-ended, i.e., to mean including but not limited to.

It will be understood that, in the description herein and throughout the claims that follow, the phrase "and/or" includes any and all combinations of one or more of the associated listed items.

It will be understood that, in the description herein and throughout the claims that follow, unless otherwise defined, all terms (including technical and scientific terms) have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

One aspect of the present disclosure is related to a frequency measurement device. The frequency measurement device can be configured to measure a frequency of an electrical power signal, a light signal, and a physiological signal. To facilitate the description to follow, measuring a frequency of an electrical power signal is taken as a descriptive example in the following paragraphs. However, the present disclosure is not limited to the embodiment below.

Figure 1:
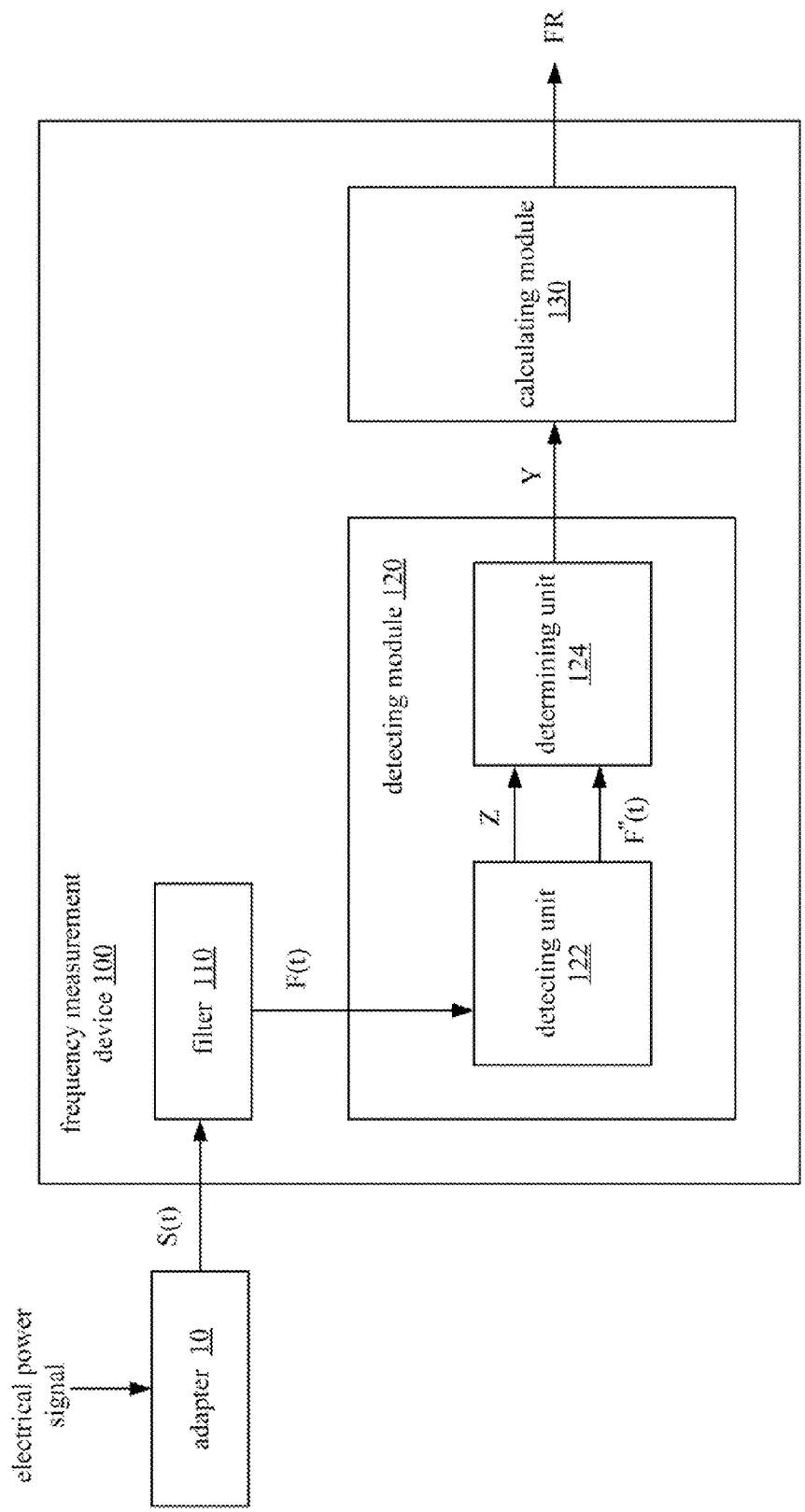
FIG. 1 is a schematic diagram of a frequency measurement device according to one embodiment of the present invention.

FIG. 1 is a schematic diagram of a frequency measurement device 100 according to one embodiment of the present invention. The frequency measurement device 100 is electrically connected to an adapter 10. The adapter 10 is used to receive an external electrical power signal and transform the electrical power signal to an input signal. S(t) with an operating voltage corresponding to the frequency measurement device 100. In one embodiment, the amplitude of the electrical power signal is 110-220 Volts, and the amplitude of the input signal S(t) is 5-12 Volts. It is noted that, in some embodiments, the adapter 10 can be omitted in a case the external electrical power signal is suitable for the operating voltage of the frequency measurement device 100.

In this embodiment, the frequency measurement device 100 includes a filter 110, a detecting module 120, and a calculating module 130. The filter 110 is electrically connected to the detecting module 120. The detecting module 120 is electrically connected to the calculating module 130.

In this embodiment, the filter 110 is configured to receive an input signal S(t), and filter the input signal S(t) to generate a signal under measurement F(t). In one embodiment, the filter 110 is an low pass filter configured to filter out high frequency noises of the input signal S(t). In further embodiments, the signal under measurement F(t) is substantially identical to the fundamental frequency signal of the input signal S(t). In other embodiments, the filter 110 can be a bandpass filter.

In this embodiment, the detecting module 120 is configured to receive the signal under measurement F(t), detect a plurality of wave peaks or a plurality of wave troughs of the signal under measurement F(t) to generate a plurality of detecting signals Y, and transmit the detecting signals Y to the calculating module 130. The detecting signals Y correspond to the wave peaks or the wave troughs respectively. In other words, the detecting module 120 generates the detecting signals Y at a plurality of time points when the signal under measurement F(t) reaches the wave peaks or reaches the wave troughs, one embodiment, the detecting 120 can generate the detecting signals Y described above through, for example, a second order differentiator. Details of the second order differentiator will be described in the paragraphs below.

In this embodiment, the calculating module 130 is configured to receive the detecting signals Y generated by the detecting module 120, and calculate a frequency FR of the signal under measurement F(t) according to the detecting signals Y. In one embodiment, the calculating module 130 is configured to calculate a time difference between time points when two adjacent of the detecting signals Y are received, and serve the time difference as a cycle period of the signal under measurement F(t). The calculating module 130 further calculates the reciprocal of the cycle period of the signal under measurement F(t) to find out the frequency FR of the signal under measurement F(t). The phrase "the time points when two adjacent of the detecting signals Y are received" used herein indicates to two time points when the signal under measurement F(t) reaches two consecutive wave peaks or two consecutive wave troughs.

Figure 2:
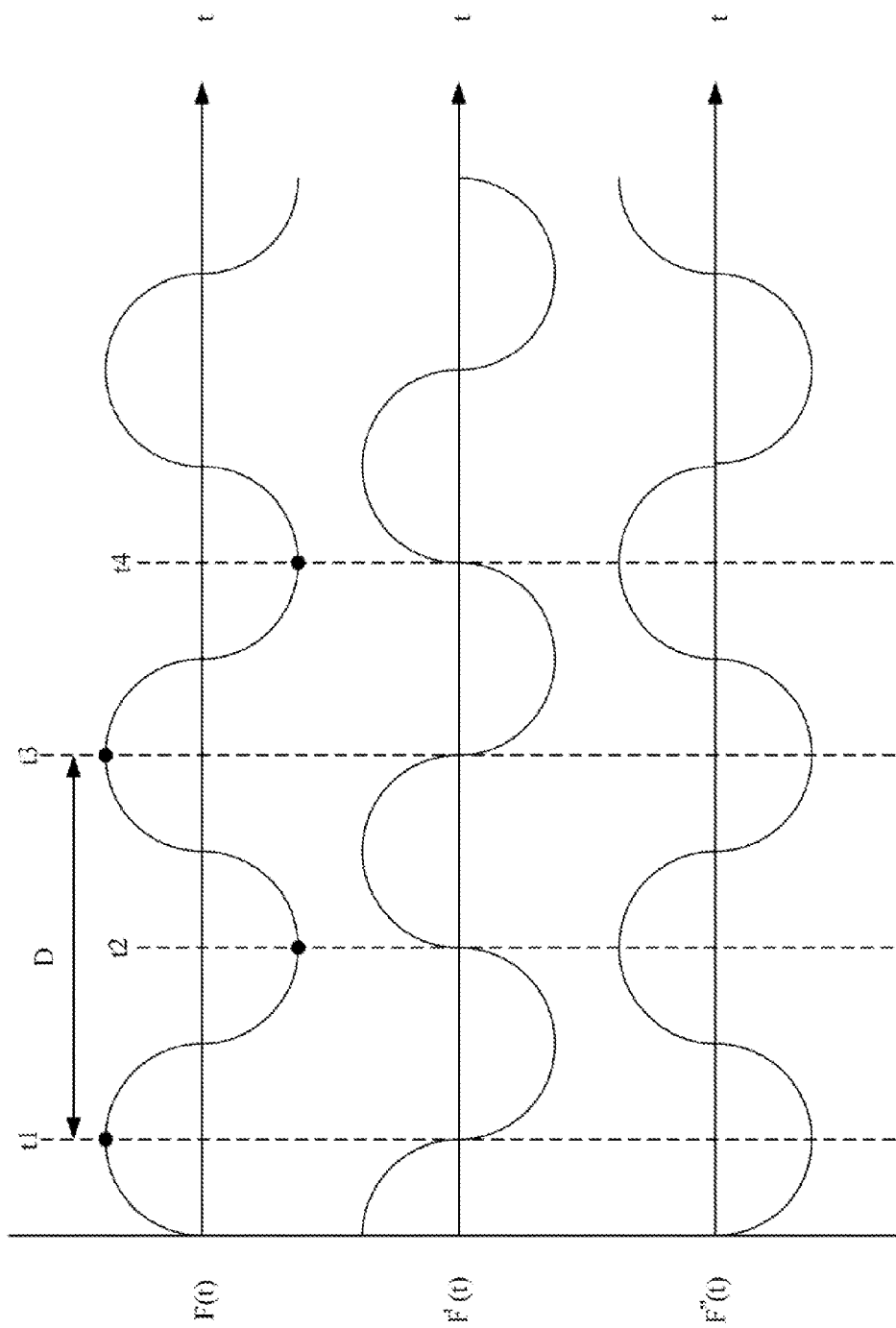
FIG. 2 illustrates different signals in one operative example.

For instance, also referring to FIG. 2, when the signal under measurement F(t) reaches a wave peak at time point t1, the detecting module 120 generates a first detecting signal Y. Subsequently, when the signal under measurement F(t) reaches a wave peaks again at time point t3, the detecting module 120 generates a second detecting signal Y. The calculating module 130 receives the first detecting signal Y and the second detecting signal Y and calculates the time difference between the time points when the first detecting signal Y and the second detecting signal Y are received. This time difference is served as the cycle period D of the signal under measurement F(t).

It is noted that, in different embodiments, the detecting module 120 can also generate the detecting signals Y at time points when the signal under measurement F(t) reaches the wave troughs. The present invention is not limited to the embodiment described above.

In one embodiment, all of the filter 110, the detecting module 120, and the calculating module 130 described above can be realized by digital circuits and/or analog circuits.

By applying one embodiment abovementioned, the frequency measurement device 100 can monitor the frequency FR of the signal under measurement F(t) in real-time, so as to ensure the stability of the frequency FR of the signal under measurement F(t). Moreover, through detecting the wave peaks or the wave troughs described above, interference of the signal under measurement F(t) causing by a direct current (DC) noise can be avoided, such that the accuracy of the frequency measurement can be ensured.

In the following paragraphs, details of the invention are provided. However, the invention is not limited by the embodiment below.

In one embodiment of the present invention, the detecting module 120 includes a detecting unit 122 and a determining unit 124. The detecting unit 122 is electrically connected to the determining unit 124.

The detecting unit 122 is configured to detect the wave peaks and the wave troughs of the signal under measurement F(t) to generate a plurality of extreme signals Z, and provide the extreme signals Z to the determining unit 124. The extreme signals Z correspond to the wave peaks and the wave troughs of the signal under measurement F(t) respectively. In other words, the detecting unit 122 generates the extreme signals Z described above at a plurality of time points when the signal under measurement F(t) reaches the wave peaks and the wave troughs.

In addition, the detecting unit 122 is configured to double differentiate the signal under measurement F(t) to generate a second order differential signal F"(t) of the signal under measurement F(t), and provide the second order differential signal F"(t) of the signal under measurement. F(t) to the determining unit 124.

The determining unit 124 is configured to receive the extreme signals Z and the second order differential signal F"(t) of the signal under measurement F(t) from the detecting unit 122, so as to generate the detecting signals Y described above. In one embodiment, the determining unit 124 generates the detecting signals Y at time points when the extreme signals Z are received and the value of the second order differential signal F"(t) of the signal under measurement F(t) is positive or negative.

For instance, referring also to FIG. 2, when the signal under measurement F(t) reaches a wave peak at time point t1, the detecting unit 122 generates a first extreme signal Z. When the signal under measurement F(t) reaches a wave trough at time point t2, the detecting unit 122 generates a second extreme signal Z. When the signal under measurement F(t) reaches a wave peak again at time point t3, the detecting unit 122 generates a third extreme signal Z. When the signal under measurement F(t) reaches a wave trough again at time point t4, the detecting unit 122 generates a fourth extreme signal Z.

In addition, when the signal under measurement F(t), for example, is a sine function (e.g., presented as +sin(ωt)), the second order differential signal F"(t) of the signal under measurement F(t) is a negative sine function (e.g., presented as −sin(ωt)). Thus, at time points t1, t2, t3, t4 (when receiving the extreme signals Z), the determining unit 124 can determine that the signal under measurement F(t) reaches the wave peaks or the wave troughs according to the fact that the value of the second order differential signal F"(t) of the signal under measurement F(t) is positive or negative, and determine whether to output the detecting signals Y.

In other words, according to the second order differential signal F"(t) of the signal under measurement F(t), the determining unit 124 selectively outputs the detecting signals Y at time points when the signal under measurement F(t) reaches the wave peaks (e.g., time points t1, t3), or outputs the detecting signals Y at time points when the signal under measurement F(t) reaches the wave troughs (e.g. time points t2, t4).

Figure 3:
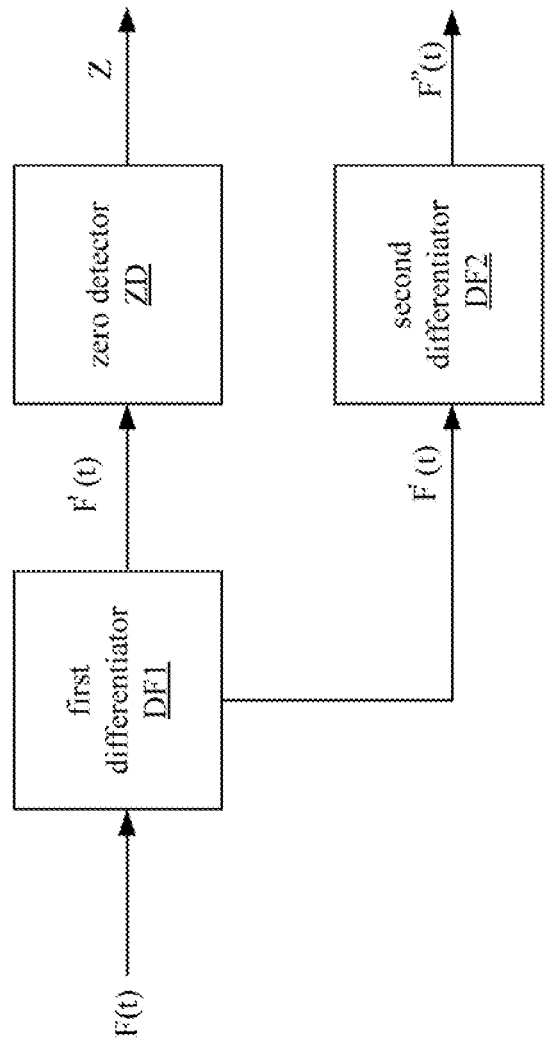
FIG. 3 is a schematic diagram of a detecting unit according to one embodiment of the present invention.

FIG. 3 is a schematic diagram of the detecting unit 122 according to one embodiment of the present invention. In this embodiment, the detecting unit 122 includes a first differentiator DF1, a second differentiator DF2, and a zero detector ZD. In this embodiment, the first differentiator DF1 is electrically connected in series to the second differentiator DF2 and the zero detector ZD separately. In one embodiment, a second order differentiator described above includes the first differentiator DF1 and the second differentiator DF2. In one embodiment, all of the first differentiator DF1, the second differentiator DF2, and the zero detector ZD can be realized by digital circuits and/or analog circuits.

In this embodiment, the first differentiator DF1 is configured to receive the signal under measurement F(t) and differentiate the signal under measurement F(t) to generate a first order differential signal F'(t) of the signal under measurement F(t). The first differentiator DF1 is configured to provide the first order differential signal F'(t) of the signal under measurement F(t) to the second differential DF2 and the zero detector ZD separately.

The second differential DF2 is configured to receive a first order differential signal F'(t) of the signal under measurement F(t), and differentiate the first order differential signal F'(t) of the signal under measurement F(t) to generate a second order differential signal F"(t) of the signal under measurement F(t).

The zero detector ZD is configured to receive the first order differential signal F'(t) of the signal under measurement F(t), detect zero points of the first order differential signal F'(t) of the signal under measurement F(t), and generate the extreme signals Z at a plurality of time points when the first order differential signal F'(t) of the signal under measurement F(t) is equal to zero.

Referring back to FIG. 2, when the signal under measurement F(t), for example, is a sine function (e.g., presented as +sin(ωt)), the first order differential signal F'(t) of the signal under measurement F(t) is a cosine function (e.g., presented as +cos(ωt)). The time points when the first order differential signal F'(t) of the signal under measurement F(t) is equal to zero are the same as the time points t1-t4 when the signal under measurement F(t) reaches the wave peaks and the wave troughs. Thus, through using the zero detector ZD to detect the zero points of the first order differential signal F'(t) of the signal under measurement F(t), the extreme signals Z can be generated at time points when the signal under measurement F(t) reaches the wave peaks and the wave troughs.

Figure 4B:
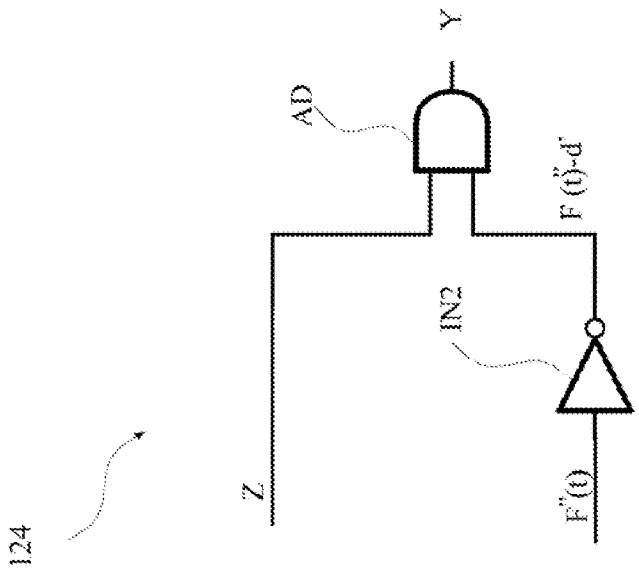
FIG. 4b is a schematic diagram of the determining unit according to another one embodiment of the present invention.
Figure 4A:
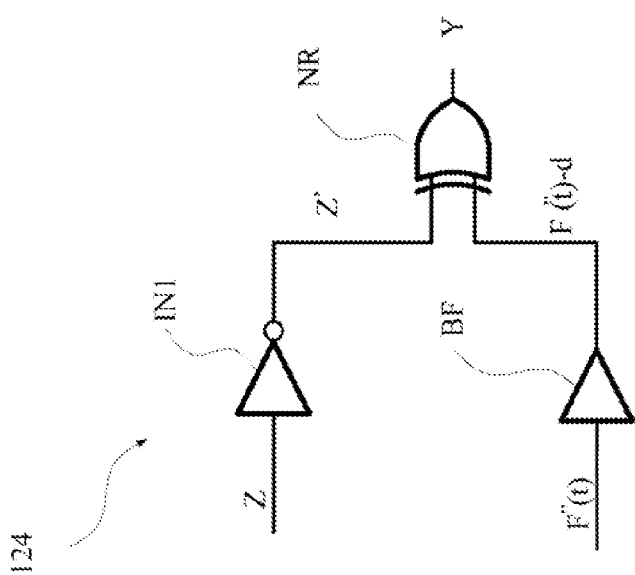
FIG. 4a is a schematic diagram of a determining unit according to one embodiment of the present invention.

FIG. 4a and FIG. 4b are schematic diagrams of the determining unit 124 according to different embodiments of the present invention.

In the embodiment in FIG. 4a, the determining unit 124, for example, includes an inverter INI, a buffer BF, and an exclusive gate NR. The inverter IN1 is configured to receive the extreme signals Z, and provide an inversed extreme signal Z' to an input terminal of the exclusive gate NR. The buffer BF is configured to receive the second order differential signal F"(t) of the signal under measurement F(t), and provide a digitized second order differential signal F"(t) of the signal under measurement F(t) (e.g., referred to as signal F"(t)-d) to another input terminal of the exclusive gate NR. The exclusve gate NR is configured to receive the inversed extreme signal Z and the signal F"(t)-d, and operatively output the detecting signals Y accordingly.

For instance, referring also to FIG. 2, at time point t1, the inverter IN1 receives the extreme signal Z (e.g., with logic level "1") and provides the inversed extreme signal Z' (e.g., with logic level "0") to the exclusive gate NR. At this time, the buffer BF receives the second order differential signal F"(t) of the signal under measurement F(t) with a value smaller than zero and outputs the signal F"(t)-d (e.g., with logic level "0"). At this time, since the logic levels of the two input terminals of the exclusive gate NR are opposite to each other, the detecting signal Y (e.g., with logic level "1") is outputted.

In additional, at time point t2, the inverter IN1 receives the extreme signal Z (e.g., with logic level "1") and provides the inverse extreme signal Z' (e.g., with logic level "0") to the exclusive gate NR. At this time, the buffer BF receives the second order differential signal F"(t) of the signal under measurement F(t) with a value greater than zero and outputs the signal F"(t)-d (e.g., with logic level "1"). At this time, since the logic levels of the two input terminal of the exclusive gate NR are identify to each other, the detecting signal Y is not outputted (e.g., a signal with logic level "0" is outputted). The operations at time points t3, t4 can he ascertained by referring to the operations previously described.

Through the configuration in FIG. 4a mentioned above, the determining unit 124 can generate the detecting signals Y at the time points when the signal under measurement F(t) reaches the wave peaks.

In the embodiment in FIG. 4b, the determining unit 124 includes, for example, an inverter IN2 and an AND gate AD. The inverter IN2 is configured to receive the second order differential signal F"(t) of the signal under measurement F(t), and provide an inversed and digitalized signal under measurement F(t) (e.g., referred to as signal F"(t)-d') to an input terminal of the AND gate AD. Another input terminal of the AND gate AD is configured to receive the extreme signals Z. The AND gate AD operatively outputs the detecting signals Y according to the extreme signals Z and the signal F"(t)-d'.

For instance, referring also to FIG. 2, at time point t1 an input terminal of the AND gate AD receives an extreme signal Z (e.g., with logic level "1"). At this time, the reverter IN2 receives the second order differential signal F"(t) of the signal under measurement F(t) with a value smaller than zero, and outputs the signal F"(t)-d' (e.g., with logic level "1"). At this time, since the two logic levels of the input terminals of the AND gate AD are logic level "1" the detecting signal V (e.g., with logic level "1") is outputted.

In addition, at time point t2, an input terminal of the AND gate AD receives the extreme signal Z (e.g., with logic level "1"). At this time, the reverter IN2 receives the second order differential signal F"(t) of the signal under measurement F(t) with a value greater than zero, and outputs the signal F"(t)-d' (e.g., with logic level "0"). At this time, since the two logic levels of the input terminals of the AND gate AD are different, the detecting signal Y is not outputted (e.g., a signal with logic level "0" is outputted). The operations at time points t3, t4 can be ascertained by referring to the operations previously described.

Through the configuration in FIG. 4b mentioned above, the determining unit 124 can also generate the detecting signals Y at the time points when the signal under measurement F(t) reaches the wave peaks.

It is noted that, in the embodiment described above, the operations that the determining unit 124 generates the detecting signals Y at the time points when the signal under measurement F(t) reaches the wave peaks is taken as an descriptive example. However, it is apparent to those of skills in the art that, by varying the configuration of determining unit 124 mentioned above, the determining unit 124 can also generate the detecting signals Y at time points when the signal under measurement F(t) reaches the wave troughs. Thus, the invention is not limited by this embodiment.

In addition, it is noted that, in the embodiment described above, all of the filter 110, the detecting module 120, and the calculating module 130 are described as being realized by using physical circuits for example. However, in practice, in other embodiments, the functions of the filter 110, the detecting module 120, and/or the calculating module 130 can be realized by performing a computer program stored in a computer readable storage medium through a processor. The processor can be, for example, a central processing unit (CPU), a digital signal processor (DSP), a digital signal processor (DSP), a micro processor or other hardware components for executing commands. In addition, the computer readable storage medium can be, for example, a ROM (read-only memory), a flash memory, a floppy disc, a hard disc, an optical disc, a flash disc, a tape, an database accessible from a network, or any type of storage element. The computer readable storage medium stores commands. The commands can be accessed and executed by the processor, so as to provide the functions of the frequency measurement device 100.

Another aspect of the present disclosure is related to a frequency measurement method. The frequency measurement method can be applied to a frequency measurement device having a structure that is same as or similar to the structure shown in FIG. 1. (However, in some embodiments, the frequency measurement method can also implemented by using a computer program product (e.g., application program). The computer program product can be stored in the computer readable storage medium, such that a computer (e.g., a processor) can process the frequency measurement method after access this medium.)

To simplify the description below, the frequency measurement device 100 shown in FIG. 1 will be used as an example to describe the frequency measurement method according to an embodiment of the present disclosure in the following paragraphs. However, the invention is not limited to the application described below.

In addition, it should be noted that, in the steps of the following frequency measurement method, no particular sequence is required unless otherwise specified. Moreover, the following steps also may be performed simultaneously or the execution times thereof may at least partially overlap.

Figure 5:
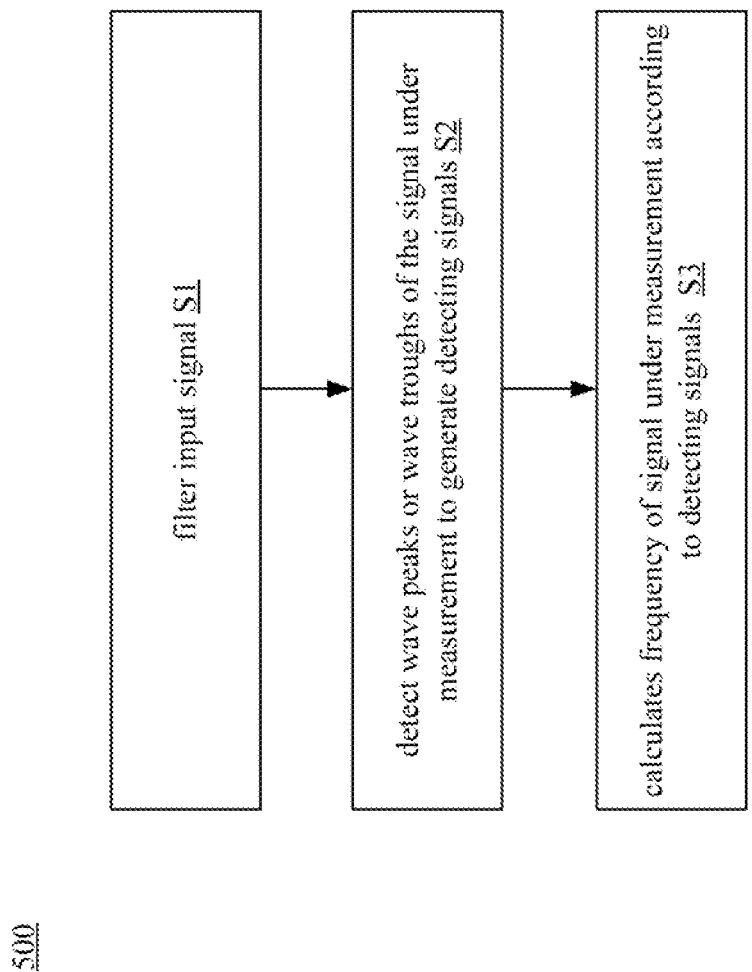
FIG. 5 is a flowchart of a frequency measurement method according to one embodiment of the present invention.

FIG. 5 is a flowchart of a frequency measurement method 500 according to one embodiment of the present invention.

In step S1, the frequency measurement device 100 filters an input signal S(t) by the filter 110 to generate a signal under measurement F(t).

In step S2, the frequency measurement device 100 detects wave peaks or wave troughs of the signal under measurement F(t) by the detecting module 120 to generate a plurality of detecting signals Y. The plurality of detecting signals Y correspond to the wave peaks or the wave troughs respectively. In one embodiment, the frequency measurement device 100 detects the wave peaks or the wave troughs of the signal under measurement F(t) by a second order differentiator.

In step S3, the frequency measurement device 100 calculates the frequency FR of the signal under measurement. F(t) by the calculating module 130. In one embodiment, the calculating module 130 calculates a time difference between time points when two adjacent of the detecting signals are generated, to serve as a cycle period of the signal under measurement F(t). Subsequently, the calculating module 130 calculates a reciprocal of the cycle period of the signal under measurement F(t) to find out the frequency FR of the signal under measurement F(t).

By applying one embodiment above mentioned, the frequency measurement device 100 can monitor the frequency FR of the signal under measurement F(t) in real-time, so as to ensure the stability of the frequency FR of the signal under measurement F(t). Moreover, through detecting the wave peaks or the wave troughs described above, interference of the signal under measurement F(t) causing by a direct current (DC) noise can be avoided, such that the accuracy of the frequency measurement can be ensured.

It is noted that details in step S1-S3 can be ascertained by referring to the paragraphs described above, and a description in this regard will not be repeated herein.

Although the present invention has been disclosed with reference to the above embodiments, these embodiments are not intended to limit the present invention. It will be apparent to those skilled in the art that various modifications and variations can be made without departing from the scope and spirit of the present invention. Therefore, the scope of the present invention shall be defined by the appended claims.

What is claimed is:

1. A frequency measurement device comprising:
    a filter configured to receive an input signal, and filter the input signal to generate a signal under measurement;
    a detecting module configured to detect a plurality of wave peaks or a plurality of wave troughs of the signal under measurement through a second order differentiator to generate a plurality of detecting signals, wherein the detecting signals correspond to the wave peaks or the wave troughs respectively, and the detecting module comprises:
        a detecting unit configured to detect the wave peaks and the wave troughs of the signal under measurement to generate a plurality of extreme signals, and double differentiate the signal under measurement through the second order differentiator to generate a second order differential signal of the signal under measurement, wheren the extreme signals correspond to the wave peaks and the wave troughs respectively, and the detecting unit comprises:
            a first differentiator configured to differentiate the signal under measurement to generate a first order differential signal of the signal under measurement;
            a second differentiator configured to differentiate the first order differential signal of the signal under measurement to generate the second order differential signal of the signal under measurement; and
            a zero detector configured to generate the extreme signals Respectively at a plurality of time points when the first order differential signal of the signal under measurement is equal to zero; and
        a determining unit configured to generate the detecting signals according to the extreme signals and the second order differential signal of the signal under measurement; and
    a calculating module configured to receive the detecting signals, and calculate a frequency of the signal under measurement according to the detecting signals.

2. The frequency measurement device as claimed in claim 1, wherein the determining unit is configured to generate the detecting signals respectively at a plurality of time points when the extreme signals are received and a value of the second order differential signal of the signal under measurement is positive or negative.

3. The frequency measurement device as claimed in claim 1, wherein the calculating module is further configured to calculate a time difference between time points when two adjacent of the detecting signals are received, to serve as a cycle period of the signal under measurement.

4. A frequency measurement method comprising:
  filtering an input signal to generate a signal under measurement;
  detecting, through a second differentiator, a plurality of the wave peaks or a plurality of wave troughs of the signal under measurement to generate a plurality of detecting signals, wherein the detecting signals correspond to the wave peaks or the wave troughs respectively; and
  calculating a frequency of the signal under measurement according to the detecting signals
  Wherein the step of detecting the wave peaks or the wave troughs to generate the detecting signals comprises:
    detecting the peaks and the wave troughs of signal under measurement to generate a plurality of extreme signals. wherein the extreme signals correspond to the wave peaks and the wave troughs respectively;
    double differentiating the signal under measurement to generate a second order differential signal of the signal under measurement: and
    generating the detecting signals according the extreme signals and the second order differential signal of the signal under measurement;
  wherin the step of detecting the wave peaks and the wave trought of the signal under measurement to generate the extreme signals comprises:
    differentiating the signal under measurement to generate a First order differential signal of the signal under measurement; and
    generating the extreme signals respectively at a plurality of time points when the first order differential signal of signal under measurement is equal to zero.

5. The frequency measurement method as claimed in claim 4, wherein the step of generating the detecting signals according the extreme signals and the second order differential signal of the signal under measurement comprises:
  generating the detecting signals respectively at a plurality of time points when the extreme signals are generated and a value of the second order differential signal of the signal under measurement is positive or negative.

6. The frequency measurement method as claimed in claim 4, wherein the step of calculating the frequency of the signal under measurement according to the detecting signals comprises:
  calculating a time difference between time points when two adjacent of the detecting signals are generated, to serve as a cycle period of the signal under measurement.

* * * * *